(12) United States Patent
Webb

(10) Patent No.: US 10,605,009 B2
(45) Date of Patent: Mar. 31, 2020

(54) IMPREGNATED CUTTING STRUCTURES, EARTH-BORING TOOLS INCLUDING THE IMPREGNATED CUTTING STRUCTURES, AND RELATED METHODS

(71) Applicant: Baker Hughes, a GE company, LLC, Houston, TX (US)

(72) Inventor: Steven W. Webb, The Woodlands, TX (US)

(73) Assignee: Baker Hughes, a GE company, LLC, Houston, TX (US)

( * ) Notice: Subject to any disclaimer, the term of this patent is extended or adjusted under 35 U.S.C. 154(b) by 175 days.

(21) Appl. No.: 15/815,234

(22) Filed: Nov. 16, 2017

(65) Prior Publication Data

US 2019/0145180 A1    May 16, 2019

(51) Int. Cl.
| | |
|---|---|
| *E21B 10/46* | (2006.01) |
| *E21B 10/567* | (2006.01) |
| *C23C 14/06* | (2006.01) |
| *C23C 16/27* | (2006.01) |
| *C22C 26/00* | (2006.01) |
| *E21B 10/54* | (2006.01) |
| *B22F 7/06* | (2006.01) |
| *B22F 7/08* | (2006.01) |
| *B22F 5/00* | (2006.01) |
| *B22F 3/12* | (2006.01) |

(52) U.S. Cl.
CPC ............ *E21B 10/567* (2013.01); *C22C 26/00* (2013.01); *C23C 14/0611* (2013.01); *C23C 16/27* (2013.01); *B22F 3/12* (2013.01); *B22F 7/062* (2013.01); *B22F 7/08* (2013.01); *B22F 2005/001* (2013.01); *B22F 2007/066* (2013.01); *B22F 2998/10* (2013.01); *E21B 10/54* (2013.01)

(58) Field of Classification Search
CPC .......................... B22F 2005/001; E21B 10/46
See application file for complete search history.

(56) References Cited

U.S. PATENT DOCUMENTS

| | | | | |
|---|---|---|---|---|
| 3,745,623 | A | * | 7/1973 | Wentorf, Jr. ............. B01J 3/062 407/119 |
| 5,128,080 | A | * | 7/1992 | Jurewicz ................. C22C 26/00 264/664 |

(Continued)

OTHER PUBLICATIONS

International Written Opinion for International Application No. PCT/US2018/061055 dated Mar. 8, 2019, 8 pages.

(Continued)

*Primary Examiner* — Catherine Loikith
(74) *Attorney, Agent, or Firm* — TraskBritt

(57) ABSTRACT

A method of forming an impregnated cutting structure for an earth-boring tool comprises providing a powder mixture comprising diamond particles and a metal binder in a press and subjecting the powder mixture to a pressure greater than about 4.0 GPa and a temperature greater than about 1,200° C. to densify the powder mixture and form an impregnated cutting structure comprising the diamond particles dispersed in a continuous phase comprising the metal binder, wherein the impregnated cutting structure is substantially free of diamond-to-diamond bonds and of carbides. Related methods of forming an earth-boring tool and a related earth-boring tool including the impregnated cutting structure.

20 Claims, 5 Drawing Sheets

(56) References Cited

U.S. PATENT DOCUMENTS

| | | |
|---|---|---|
| 7,976,596 B2* | 7/2011 | Egan .................. B22F 3/105 |
| | | 51/293 |
| 8,069,936 B2 | 12/2011 | Scott et al. |
| 8,720,612 B2* | 5/2014 | Corbett .................. B22F 7/06 |
| | | 175/426 |
| 8,911,522 B2 | 12/2014 | Cleboski et al. |
| 9,200,484 B2 | 12/2015 | Cleboski et al. |
| 9,267,333 B2 | 2/2016 | Doster |
| 9,956,666 B2* | 5/2018 | Corbett .................. B22F 7/06 |
| 2005/0230150 A1 | 10/2005 | Oldham et al. |
| 2005/0230155 A1 | 10/2005 | Sung |
| 2006/0081402 A1 | 4/2006 | Lockwood et al. |
| 2008/0202821 A1 | 8/2008 | McClain et al. |
| 2010/0181116 A1 | 7/2010 | Stauffer |
| 2012/0080240 A1 | 4/2012 | Green et al. |
| 2014/0262542 A1 | 9/2014 | Cai et al. |
| 2016/0129555 A1 | 5/2016 | Bilen et al. |

OTHER PUBLICATIONS

International Search Report for International Application No. PCT/US2018/061055 dated Mar. 8, 2019, 4 pages.

* cited by examiner

IMPREGNATED CUTTING STRUCTURES, EARTH-BORING TOOLS INCLUDING THE IMPREGNATED CUTTING STRUCTURES, AND RELATED METHODS

TECHNICAL FIELD

Embodiments of the disclosure relate generally to earth-boring tools including one or more impregnated cutting structures, to related impregnated cutting structures, and to related methods. More particularly, embodiments of the disclosure relate to earth-boring tools including impregnated cutting structures formed under high temperature high pressure conditions, to related impregnated cutting structures, and to related methods of forming the impregnated cutting structures and the earth-boring tools.

BACKGROUND

Wellbores are formed in subterranean formations for various purposes including, for example, the extraction of oil and gas from a subterranean formation and the extraction of geothermal heat from the subterranean formation. A wellbore may be formed in a subterranean formation using a drill bit, such as, an earth-boring rotary drill bit. Different types of earth-boring rotary drill bits are known in the art, including, for example, fixed-cutter bits (which are often referred to in the art as "drag" bits), including impregnated bits (having cutting structures impregnated with diamonds or other superabrasive particles), and hybrid bits (which may include, for example, both fixed cutters and rolling cutters, at least one of which may include one or more impregnated cutting structures).

The drill bit is coupled, either directly or indirectly, to an end of what is referred to in the art as a "drill string," which comprises a series of elongated tubular segments connected end-to-end that extends into the wellbore from the surface of the formation. Often various tools and components, including the drill bit, may be coupled together at the distal end of the drill string at the bottom of the wellbore being drilled. This assembly of tools and components is referred to in the art as a "bottom hole assembly" (BHA).

The drill bit may be rotated within the wellbore by rotating the drill string from the surface of the earth using a rotary table or top drive, or the drill bit may be rotated by coupling the drill bit to a downhole motor, which is also coupled to the drill string and disposed proximate the bottom of the wellbore. In some instances, the drill string is simultaneously rotated from the surface and by a downhole motor. The downhole motor may comprise, for example, a hydraulic Moineau-type motor having a shaft, to which the drill bit is attached, that may be caused to rotate by pumping fluid (e.g., drilling mud or fluid) from the surface of the formation down through the center of the drill string, through the hydraulic motor, out from nozzles in the drill bit, and back up to the surface of the formation through the annular space between the outer surface of the drill string and the exposed surface of the formation within the wellbore.

Superabrasive-impregnated earth-boring rotary drill bits and other tools may be used for drilling hard or abrasive rock formations such as sandstones. Typically, a superabrasive-impregnated bit has a solid body, which is often referred to in the art as a "crown," that is cast in a mold. The crown is attached to a steel shank having a threaded end that may be used to attach the crown and steel shank to a drill string. The crown may have a variety of configurations and generally includes a cutting face having a plurality of cutting structures, which may include at least one of cutting segments, posts, and/or blades. The posts and/or blades may be integrally formed with the crown in the mold, or they may be separately formed, as by a sintering or hot isostatic press (HIP) process, and attached to the crown. Channels extend between the posts and blades to allow drilling fluid to flow over the face of the bit and through the channels.

Superabrasive-impregnated drill bits may be formed such that the cutting face of the drill bit (including the segments, posts, blades, etc.) comprises a particle-matrix composite material that includes hard particles (e.g., superabrasive particles) dispersed throughout a matrix material and binder. The superabrasive particles may comprise natural or synthetic diamond or cubic boron nitride, the matrix material is conventionally cobalt-cemented tungsten carbide (WC—Co), and the binder may comprise copper.

While drilling with a superabrasive-impregnated bit, the matrix material and the binder surrounding the superabrasive particles wears at a faster rate than do the superabrasive particles. As the matrix material and binder surrounding the superabrasive particles on the surface of the bit wears away, the exposure of the superabrasive particles at the surface gradually increases until the superabrasive particles eventually fall away. As some superabrasive particles are falling away, others that were previously completely buried become exposed, such that fresh, sharp superabrasive particles are continuously being exposed and used to cut the earth formation.

A drill bit with integral impregnated posts is conventionally formed, in some instances, by mixing and distributing hard particles and matrix material powder (e.g., cemented tungsten carbide) in a mold cavity configured with an interior topography to receive same and define cutting structures. The particle mixture is then infiltrated with a molten metal binder material, such as a copper-based metal alloy. After infiltration, the molten metal matrix material is allowed to cool and solidify. The resulting drill bit including the integral impregnated posts may then be removed from the mold.

In other instances, an impregnated post is formed by forming a mixture including hard particles, a cemented carbide matrix material, and a binder in a hot isostatic press. The mixture is disposed in a press and pressed into a green body, which is then sintered by exposure to a hot isostatic pressing process wherein the green body is densified.

BRIEF SUMMARY

Embodiments disclosed herein include impregnated cutting structures, earth-boring tools including impregnated cutting structures, and related methods of forming the impregnated cutting structures and earth-boring tools including the impregnated cutting structures. For example, in some embodiments, a method of forming an impregnated cutting structure for an earth-boring tool comprises providing a powder mixture comprising diamond particles and a metal binder in a press, and subjecting the powder mixture to a pressure greater than about 4.0 GPa and a temperature greater than about 1,200° C. to densify the powder mixture and form an impregnated cutting structure comprising the diamond particles dispersed in a continuous phase comprising the metal binder, wherein the impregnated cutting structure is substantially free of diamond-to-diamond bonds and of carbides.

In additional embodiments, a method of forming an earth-boring tool including an impregnated cutting structure comprises forming an impregnated cutting structure, forming the impregnated cutting structure comprising providing a powder mixture comprising diamond particles and a metal binder in a press, and subjecting the powder mixture to a pressure greater than about 4.0 GPa and a temperature greater than about 1,200° C. to densify the powder mixture and form an impregnated cutting structure comprising the diamond particles dispersed in a matrix material comprising the metal binder, wherein the impregnated cutting structure is substantially free of diamond-to-diamond bonds and carbides. The method further includes attaching the impregnated cutting structure to a blade of an earth-boring tool.

In yet additional embodiments, an earth-boring tool for drilling subterranean formations comprises a bit body, at least one blade in a crown region of the bit body, and at least one impregnated cutting structure attached to the at least one blade, the at least one impregnated cutting structure comprising diamond particles dispersed substantially uniformly in a continuous matrix phase in at least one region of at least one impregnated cutting structure, the at least one impregnated cutting structure substantially free of diamond-to-diamond bonds and carbides, and formed by exposing a powder mixture comprising the diamond particles and a binder material to a pressure greater than about 4.0 GPa and a temperature greater than about 1,200° C.

BRIEF DESCRIPTION OF THE DRAWINGS

While the specification concludes with claims particularly pointing out and distinctly claiming what are regarded as embodiments of the invention, advantages of the invention can be more readily ascertained from the following detailed description when read in conjunction with the accompanying drawings in which:

DETAILED DESCRIPTION

Figure 1:
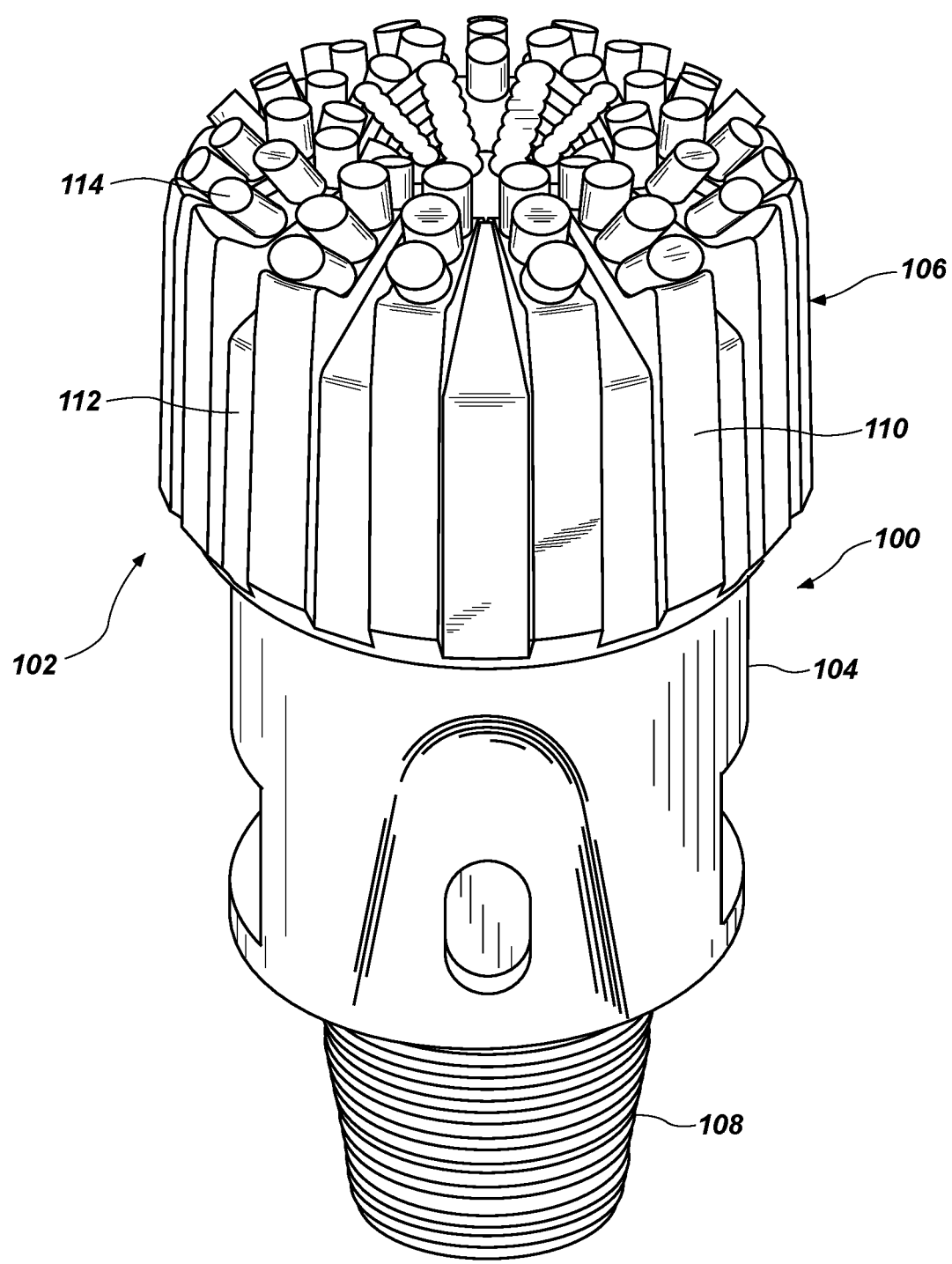
FIG. 1 is a simplified perspective view of an earth-boring tool including impregnated cutting structures, in accordance with embodiments of the disclosure.

Illustrations presented herein are not meant to be actual views of any particular material, component, or system, but are merely idealized representations that are employed to describe embodiments of the disclosure.

The following description provides specific details, such as material types, compositions, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional techniques employed in the industry. In addition, the description provided below does not form a complete process flow for forming impregnated cutting structures or an earth-boring tool including the impregnated cutting structures. Only those process acts and structures necessary to understand the embodiments of the disclosure are described in detail below. A person of ordinary skill in the art will understand that some process components are inherently disclosed herein and that adding various conventional process components and acts would be in accordance with the disclosure. Additional acts or materials to form an impregnated cutting structure or an earth-boring tool including the impregnated cutting structures may be performed by conventional techniques.

As used herein, the term "impregnated cutting structure" means and includes any integral or preformed post, stud, or cutting structure of a drill bit or other earth-boring tool (including, for example, fixed-cutter bits and hybrid bits including both fixed and rotating cutting structures) that includes a substantially uniform distribution of superabrasive particles dispersed in at least one region of the impregnated cutting structure intended to cut, crush, abrade, or otherwise remove a portion of a subterranean formation. The impregnated cutting structure may be substantially free of diamond-to-diamond bonds (e.g., direct diamond-to-diamond bonds).

As used herein, the term "superabrasive particles" refers to particles having a Vickers Hardness of at least about 1200 HV30, as measured according to ASTM Standard E384 (Standard Test Method for Knoop and Vickers Hardness of Materials, ASTM Int'l, West Conshohocken, Pa., (2010)). Superabrasive particles may include natural or synthetic diamond (including agglomerations of thermally stable polycrystalline diamond particles (TSPs), cubic boron nitride (CBN), a combination of diamond and CBN, or any other particles that have similar hardness.

As used herein, the term "high temperature high pressure" (HTHP) conditions means and includes conditions including temperatures greater than about 1,200° C. and pressures greater than about 4.0 GPa (about 40 kbar).

According to embodiments disclosed herein, one or more components of a drill bit, such as one or more impregnated cutting structures thereof, may comprise a composite material that includes one or more types of superabrasive particles dispersed in a binder material. The superabrasive particles may include diamond particles, cubic boron nitride particles, or a combination thereof. The binder material may include a metal material, such as tungsten, titanium, iron, nickel, cobalt, vanadium, zirconium, niobium, tantalum, chromium, molybdenum, manganese, silver, copper, alloys thereof, or combinations thereof. In some embodiments, the impregnated cutting structures are substantially free of a cemented carbide matrix material (e.g., cemented tungsten carbide) and consist essentially of the binder material and the superabrasive particles.

The impregnated cutting structure may be formed by exposing a mixture comprising the superabrasive particles and the binder material to high temperature high pressure (HTHP) conditions. In some embodiments, forming the impregnated cutting structure at high temperature conditions may facilitate forming the impregnated cutting structure with a binder material exhibiting a higher melting point relative to binders used to form conventional impregnated structures. The higher pressure may facilitate forming the impregnated cutting structure at the higher temperature without damaging the superabrasive particles, such as by causing graphitization of diamond particles. The binder material may be selected such that it exhibits a melting temperature greater than about 1,200° C., such as greater than about 1,300° C., greater than about 1,400° C., greater than about 1,500° C., greater than about 1,600° C., greater than about 1,700° C., greater than about 1,800° C., greater than about 1,900° C., or even greater than about 2,000° C. Accordingly, the mixture including the superabrasive particles and the binder material may be sintered at higher temperatures and pressures without damaging the material of the superabrasive particles. The resulting impregnated cutting structure may exhibit an increased density, a reduced porosity, an increased strength, and an increased hardness compared to conventional impregnated cutting structures. In addition, forming the impregnated structure at HTHP conditions may increase adhesion bonding between the superabrasive particles and the matrix material. Such impregnated cutting structures may exhibit improved performance at operating conditions (e.g., temperatures encountered downhole) and may wear at a slower rate relative to conventional impregnated cutting structures. Accordingly, drill bits including impregnated cutting structures formed according to the methods described herein may have an extended operating life compared to conventionally formed impregnated cutting structures.

FIG. 1 is a simplified, illustration of a drill bit 100 including a plurality of cutting features comprising an impregnated material. The drill bit 100 may include a bit body 102 comprising a metal shank 104 having one end attached to a crown region 106 and an opposing end having threads 108 for attachment to a drill string.

The crown region 106 may include a plurality of blades 110. The blades 110 may be separated from each other by fluid channels 112. A plurality of impregnated cutting structures 114 may extend from the blades 110. The impregnated cutting structures 114 may comprise a composite material comprising a plurality of grains of a superabrasive material dispersed in a binder material, such as a metal binder material. In some embodiments, a portion of the impregnated cutting structures 114 are disposed in pockets formed in the blades 110.

Figure 2:
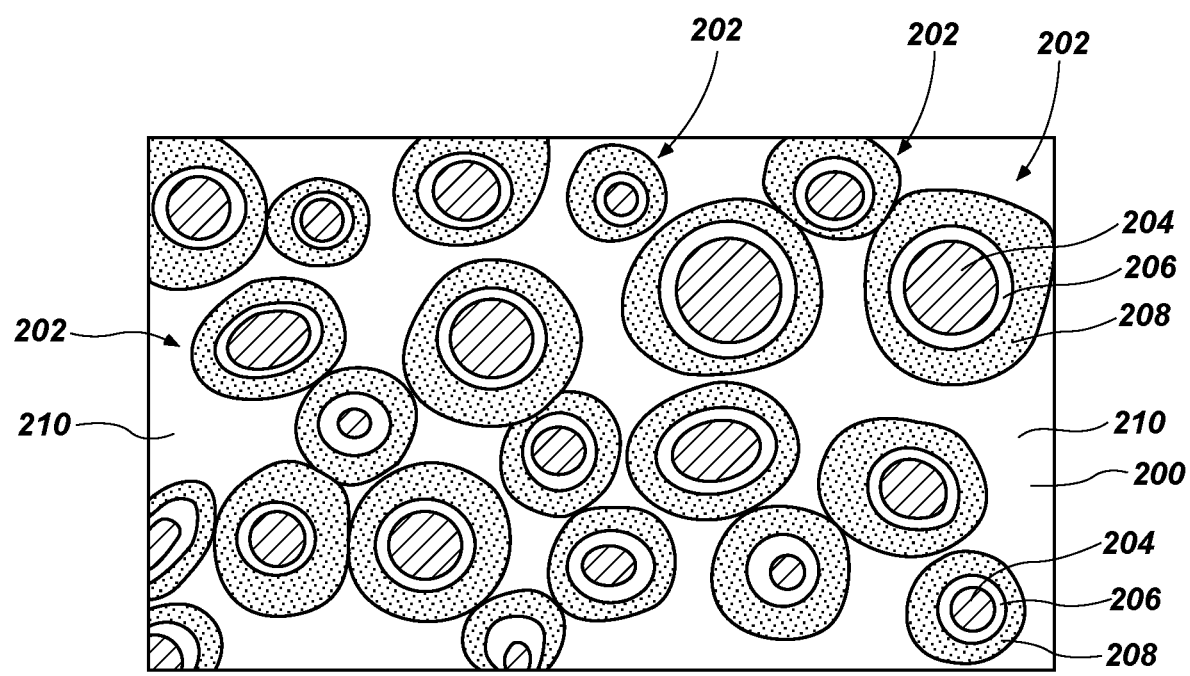
FIG. 2 is a simplified illustration showing one example of how the microstructure of an embodiment of a composite material of an impregnated cutting structure may appear under magnification, in accordance with embodiments of the disclosure.

FIG. 2 is a schematic of how a microstructure of an embodiment of a composite material 200 of the impregnated cutting structures 114 (FIG. 1) may appear under magnification. The composite material 200 may include a plurality of coated (e.g., encapsulated) superabrasive particles 202 dispersed in a binder material 210. The coated superabrasive particles 202 may include, for example, superabrasive particles 204 surrounded by one or more metal coatings, such as a first coating 206 and a second coating 208. In other embodiments, the superabrasive particles 204 may not be coated.

The superabrasive particles 204 may include diamond particles, agglomerations of thermally stable polycrystalline diamond particles (TSPs), cubic boron nitride (CBN) particles, or combinations thereof. The superabrasive particles 204 may be natural or synthetic, and may be single-crystal particles or polycrystalline particles.

In some embodiments, the superabrasive particles 204 comprise diamond particles. The diamond particles may be single-crystal diamond, polycrystalline diamond, or a combination thereof. In some such embodiments, the diamond particles may have a cubic, octahedral, or cuboctahedral shape with at least substantially planar facets or sides.

As a nonlimiting example, the superabrasive particles 204 may comprise diamond particles having a size (e.g., a diameter) between about 20 µm and about 2,000 µm, such as between about 20 µm and about 50 µm, between about 50 µm and about 100 µm, between about 100 µm and about 200 µm, between about 200 µm and about 400 µm, between about 400 µm and about 600 µm, between about 600 µm and about 800 µm, between about 800 µm and about 1,000 µm, between about 1,000 µm and about 1,500 µm, or between about 1,500 µm and about 2,000 µm.

The superabrasive particles 204 may exhibit a Gaussian or a log-normal particle size distribution. In additional embodiments, the superabrasive particles 204 may have a multi-modal particle size distribution (e.g., bi-modal, tri-modal, penta-modal, etc.).

The superabrasive particles 204 may be coated with the first coating 206 and the second coating 208. The first coating 206 may comprise a metal, such as, for example, a transition metal such as tungsten, titanium, iron, nickel, cobalt, vanadium, zirconium, niobium, tantalum, chromium, molybdenum, manganese, silver, a metal carbide (e.g., tungsten carbide, titanium carbide, tantalum carbide, silicon carbide, etc.), or combinations thereof. In some embodiments, the first coating 206 comprises iron, nickel, cobalt, or combinations thereof. The first coating 206 may reduce or prevent degradation of, or damage to, the superabrasive particles 204 during any subsequent HTHP processes to which the superabrasive particles 204 or the coated superabrasive particles 202 may be exposed. The first coating 206 may at least substantially completely coat the exterior surface of the superabrasive particles 204.

The second coating 208 may comprise a metal, such as, for example, a transition metal such as tungsten, titanium, iron, nickel, cobalt, vanadium, zirconium, niobium, tantalum, chromium, molybdenum, manganese, silver, or combinations thereof. In some embodiments, the second coating 208 comprises a different material than the first coating 206. The second coating 208 may be formulated and configured to control a space between the superabrasive particles 204 in the composite material 200.

The first coating 206 and the second coating 208 may be formed on the superabrasive particles 204 using, for example, a chemical vapor deposition (CVD) process, a physical vapor deposition (PVD) process, or another deposition process. In other embodiments, the first coating 206 and the second coating 208 may be formed on the superabrasive particles 204 in a fluidized bed. In yet other embodiments, the first coating 206 and the second coating 208 may be formed on the superabrasive particles 204 using, for example, a tumble mill process in which the superabrasive particles 204 are milled in a tumble mill together with a powder mixture comprising the material or materials that will form the first coating 206 and the second coating 208.

A thickness of each of the first coating 206 and the second coating 208 may be between about 0.5 mm and about 2.0 mm, such as between about 0.5 mm and about 1.0 mm, between about 1.0 mm and about 1.5 mm, or between about 1.5 mm and about 2.0 mm. In some embodiments, a thickness of each of the first coating 206 and the second coating 208 is about 1.0 mm. However, the disclosure is not so limited to a particular thickness of either of the first coating 206 and the second coating 208.

Although the coated superabrasive particles 202 have been described as including the first coating 206 and the second coating 208, the disclosure is not so limited. In other embodiments, the coated superabrasive particles 202 include only one coating. In other embodiments, the coated superabrasive particles 202 include more than two coatings, such as three coatings, four coatings, etc. In yet other embodiments, the superabrasive particles 204 may not be coated with a coating material.

The superabrasive particles 204 may constitute between about 5 volume percent (vol. %) and about 45 volume percent of the composite material 200, such as between about 5 volume percent and about 10 volume percent, between about 10 volume percent and about 20 volume percent, between about 20 volume percent and about 30 volume percent, between about 30 volume percent and about 35 volume percent, between about 35 volume percent and about 40 volume percent, or between about 40 volume percent and about 45 volume percent of the composite material 200. In some embodiments, the superabrasive particles 204 constitute about 30 volume percent of the composite material 200.

The binder material 210 may include a metal binder formulated and configured to bind the superabrasive particles 204 in the binder material 210. The binder material 210 may include a commercially pure metal such as tungsten, titanium, iron, nickel, cobalt, vanadium, zirconium, niobium, tantalum, chromium, molybdenum, or manganese. In other embodiments, the binder material 210 may include a metal alloy, such as a tungsten-based alloy, a titanium-based alloy, an iron-based alloy, a nickel-based alloy, a cobalt-based alloy, a vanadium-based alloy, a zirconium-based alloy, a niobium-based alloy, a tantalum-based alloy, a chromium-based alloy, a molybdenum-based alloy, a manganese-based alloy, a silver-based alloy, or a copper-based alloy. In some embodiments, the binder material 210 includes a copper-nickel alloy, such as an alloy comprising about 50 weight percent copper and about 50 weight percent nickel. In some embodiments, the binder material 210 may be selected to comprise the same material as at least one of the first coating 206 and the second coating 208.

In some embodiments, the binder material 210 comprises iron and at least one of tungsten, titanium, nickel, cobalt, vanadium, zirconium, niobium, tantalum, chromium, molybdenum, manganese, and silver. A weight percent of iron in the binder material 210 may be between about 20 weight percent and about 80 weight percent, such as between about 20 weight percent and about 40 weight percent, between about 40 weight percent and about 60 weight percent, or between about 60 weight percent and about 80 weight percent. A weight percent of the at least one of tungsten, titanium, nickel, cobalt, vanadium, zirconium, niobium, tantalum, chromium, molybdenum, manganese, and silver in the binder material 210 may be between about 20 weight percent and about 80 weight percent, such as between about 20 weight percent and about 40 weight percent, between about 40 weight percent and about 60 weight percent, or between about 60 weight percent and about 80 weight percent. In some embodiments, the binder material 210 comprises about 50 weight percent iron and about 50 weight percent of at least one of nickel and cobalt. In some embodiments, the binder material 210 may consist essentially of iron and nickel, iron and cobalt, or iron, nickel, and cobalt.

In some embodiments, the binder material 210 may comprise cobalt and at least one of tungsten, titanium, nickel, iron, vanadium, zirconium, niobium, tantalum, chromium, molybdenum, manganese, and silver. A weight percent of each of the cobalt and the at least one of tungsten, titanium, nickel, iron, vanadium, zirconium, niobium, tantalum, chromium, molybdenum, manganese, and silver in the binder material 210 may be between about 20 weight percent and about 40 weight percent, between about 40 weight percent and about 60 weight percent, or between about 60 weight percent and about 80 weight percent.

In further embodiments, the binder material 210 may comprise nickel and at least one of tungsten, titanium, cobalt, iron, vanadium, zirconium, niobium, tantalum, chromium, molybdenum, manganese, and silver. A weight percent of each of the nickel and the at least one of tungsten, titanium, cobalt, iron, vanadium, zirconium, niobium, tantalum, chromium, molybdenum, manganese, and silver in the binder material 210 may be between about 20 weight percent and about 40 weight percent, between about 40 weight percent and about 60 weight percent, or between about 60 weight percent and about 80 weight percent.

In some embodiments, the binder material 210 may comprise chromium and at least one of tungsten, titanium, cobalt, iron, vanadium, zirconium, niobium, tantalum, nickel, molybdenum, manganese, and silver. A weight percent of each of the chromium and the at least one of tungsten, titanium, cobalt, iron, vanadium, zirconium, niobium, tantalum, nickel, molybdenum, manganese, and silver in the binder material 210 may be between about 20 weight percent and about 40 weight percent, between about 40 weight percent and about 60 weight percent, or between about 60 weight percent and about 80 weight percent. In some embodiments, the binder material 210 comprises chromium and at least one of iron, nickel, and cobalt.

The binder material 210 may be formulated and configured to exhibit a melting temperature greater than about 1,200° C., greater than about 1,250° C., greater than about 1,300° C., greater than about 1,400° C., greater than about 1,500° C., greater than about 1,600° C., greater than about 1,700° C., greater than about 1,800° C., greater than about 1,900° C., or even greater than about 2,000° C. In some embodiments, the binder material 210 may be selected such that no component thereof (e.g., no element thereof) has a melting point less than any of the aforementioned temperatures (e.g., less than about 1,200° C., less than about 1,250° C., etc.).

In some embodiments, the binder material 210 may be substantially free of copper, tin, zinc, or any combination thereof.

The composite material 200 may be formed without any carbide materials, such as cemented tungsten carbide. Stated another way, the composite material 200 may be substantially free of carbide materials. In some such embodiments, the composite material 200 consists essentially of the metal binder 210 and the coated superabrasive particles 202.

Figure 3:
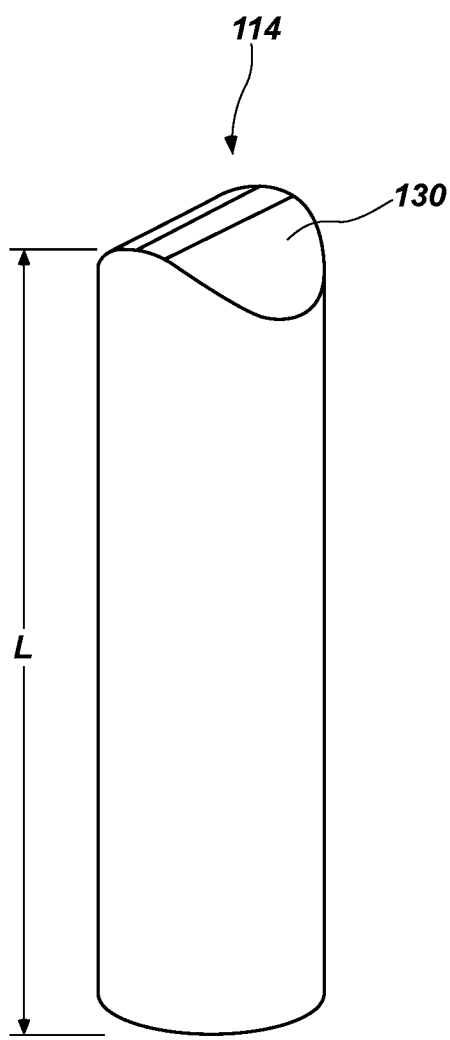
FIG. 3 is a perspective view of an impregnated cutting structure including the composite material, in accordance with embodiments of the disclosure.

FIG. 3 is a stand-alone perspective view of one of the impregnated cutting structures 114 (FIG. 1). The impregnated cutting structure 114 may be elongated and may have a length L of at least about 1.0 cm (and may be referred to as a so-called "impregnated post"). In some embodiments, the length L may be adjusted based on the desired distance by which the impregnated cutting structures 114 are to extend beyond the face of the bit body (102 (FIG. 1)). By way of nonlimiting example, the length L may be at least about 1.0 cm, at least about 1.5 cm, at least about 2.0 cm, at least about 3.0 cm, at least about 4.0 cm, or even at least about 5.0 cm.

The impregnated cutting structure 114 may have a substantially cylindrical shape. In other embodiments, the impregnated cutting structure 114 may exhibit an oval cross-sectional shape or another cross-sectional shape. The impregnated cutting structure 114 may include one or more angled (e.g., tapered) surfaces 130 configured to engage a subterranean formation. In other embodiments, the impregnated cutting structure 114 may not include the angled surface 130, as shown in FIG. 1.

Figure 4:
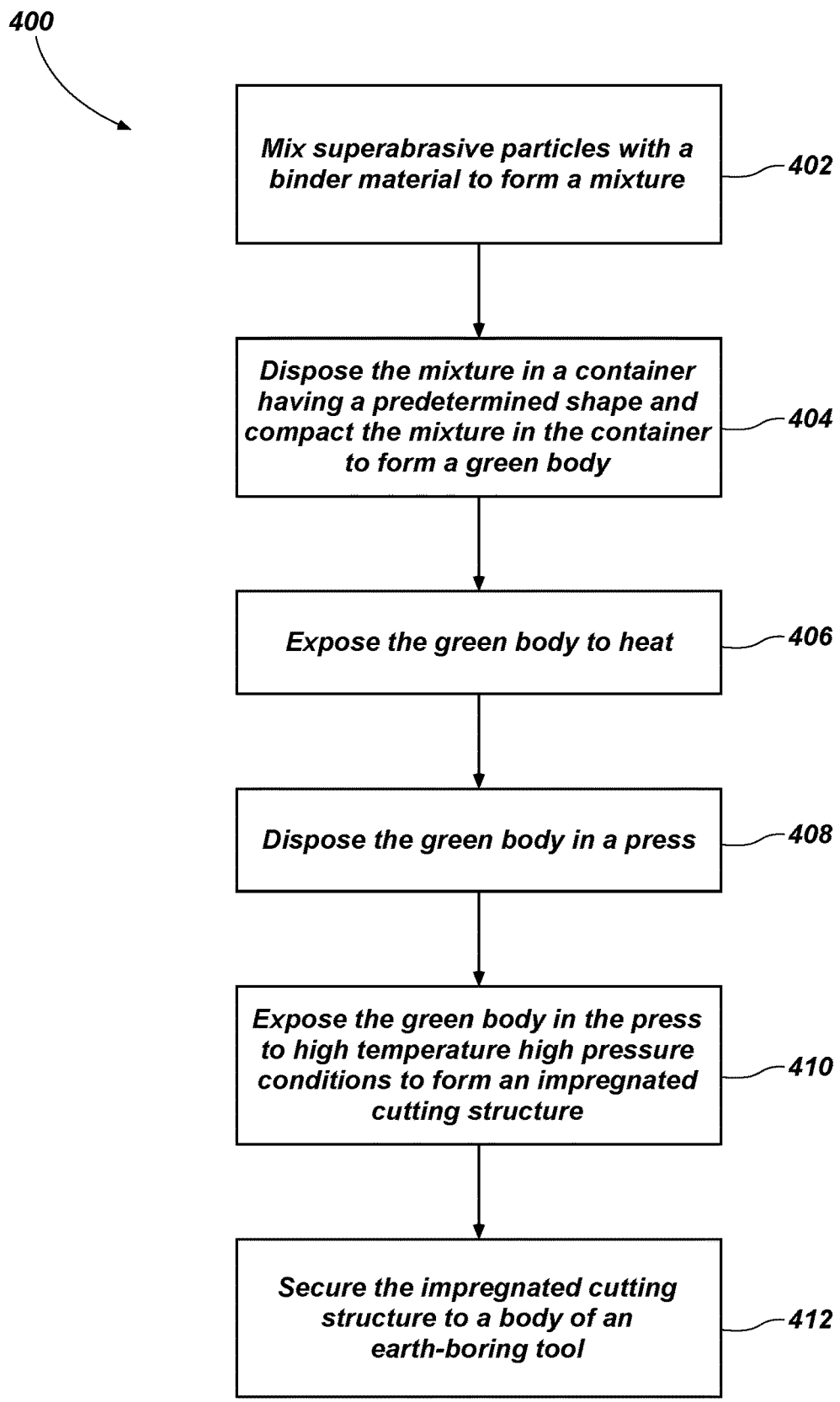
FIG. 4 is a simplified flow diagram illustrating a method of forming an earth-boring tool including an impregnated cutting structure, in accordance with embodiments of the disclosure.

FIG. 4 is a simplified flow diagram illustrating a method 400 for forming the impregnated cutting structures and attaching the impregnated cutting structures to an earth-boring tool. The method 400 may include act 402 including mixing superabrasive particles with a binder material to form a mixture; act 404 including disposing the mixture in a container having a predetermined shape (e.g., a shape of an impregnated cutting structure to be formed) and compacting the mixture in the container to form a green body; act 406 including exposing the green body to heat; act 408 including disposing the green body in a press; act 410 including exposing the green body in the press to HTHP conditions to form an impregnated cutting structure; and act 412 including securing the impregnated cutting structure to a body of an earth-boring tool.

Act 402 may include mixing superabrasive particles with a binder material to form a mixture. The superabrasive particles may be similar to the superabrasive particles 204 described above with reference to FIG. 2. In some embodiments, the superabrasive particles comprise diamond particles. The binder material may be substantially similar to the binder materials described above. In some embodiments, the binder material may be selected to have a melting temperature greater than at least about 1,200° C.

The mixture may include between about 5 volume percent and about 45 volume percent of the superabrasive particles, such as between about 5 volume percent and about 10 volume percent, between about 10 volume percent and about 20 volume percent, between about 20 volume percent and about 30 volume percent, between about 30 volume percent and about 35 volume percent, between about 35 volume percent and about 40 volume percent, or between about 40 volume percent and about 45 volume percent. In some embodiments, the binder material may constitute between about 55 volume percent and about 95 volume percent of the mixture, such as between about 55 volume percent and about 65 volume percent, between about 65 volume percent and about 75 volume percent, between about 75 volume percent and about 85 volume percent, or between about 85 volume percent and about 95 volume percent of the mixture.

Act 404 may include disposing the mixture in a container having a predetermined shape, such as a desired shape of an impregnated cutting structure to be formed, and compacting the mixture in the container to form a green body. The mixture in the container may be exposed to a pressure to form the green body. By way of nonlimiting example, the mixture may be exposed to a pressure between about 100 MPa (about 1 kbar) and about 1,000 MPa (10 kbar), such as between about 100 MPa (about 1.0 kbar) and about 250 MPa (about 2.5 kbar), between about 250 MPa (about 2.5 kbar) and about 500 MPa (about 5.0 kbar), between about 500 MPa (about 5.0 kbar) and about 750 MPa (about 7.5 kbar), or between about 750 MPa (about 7.5 kbar) and about 1,000 MPa (about 10.0 kbar). In some embodiments, the mixture may be exposed to a pressure as high as 6.5 GPa (about 65 kbar) or more. In some embodiments, the mixture is not exposed to heat during compaction thereof to form the green body. In some such embodiments, the green body may be formed at room temperature (e.g., between about 20° C. and about 25° C.).

In some embodiments, forming the green body may include forming the green body to have a theoretical density greater than about 60%.

Act 406 may include exposing the green body to heat. Exposing the green body to heat may remove any organic binders (e.g., wax), plasticizers, lubricants, or other additives present in the mixture therefrom. By way of nonlimiting example, the green body may be exposed to a temperature between about 100° C. and about 400° C., such as between about 200° C. and about 300° C. Accordingly, after exposing the green body to heat, the green body may be substantially free of additives and may consist essentially of the superabrasive particles (and any coatings thereon) and the binder material.

Act 408 may include disposing the green body in an HTHP sintering press. The press may include, for example, a cubic press, a belt press, a toroid press, or another press. The press may be configured to expose the green body to HTHP conditions (e.g., temperatures greater than about 1,200° C. and pressures greater than about 4.0 GPa (about 40 kbar)).

Act 410 may include exposing the green body in the press to HTHP conditions to form an impregnated cutting structure. Exposing the green body to HTHP conditions in the press may be referred to herein as a so-called "super-hot isostatic pressing" or a "super-HIP" method.

The green body may be exposed to a temperature greater than about 1,200° C., greater than about 1,250° C., greater than about 1,300° C., greater than about 1,400° C., greater than about 1,500° C., greater than about 1,600° C., greater than about 1,700° C., greater than about 1,800° C., greater than about 1,900° C., or even greater than about 2,000° C. In some embodiments, the green body may be exposed to a temperature that is below a melting temperature of the binder material. In some embodiments, the green body is exposed to a temperature of below about a liquidus temperature (e.g., below about 5° C. the liquidus temperature) of the binder or a temperature below about the liquidus temperature of a component of the binder material exhibiting the lowest melting temperature. Accordingly, in some embodiments, exposing the green body to HTHP conditions may include exposing the mixture to a pressure and temperature such that the binder material does not melt. In some embodiments, the green body is exposed to a temperature of about 1,400° C.

The green body may be exposed to a pressure greater than about 4.0 GPa (40 kbar), such as a pressure between about 4.0 GPa (about 40 kbar) and about 8.5 GPa (about 85 kbar). By way of nonlimiting example, the green body may be exposed to a pressure between about 4.0 GPa (about 40 kbar) and about 5.0 GPa (about 50 kbar), between about 5.0 GPa (about 50 kbar) and about 6.0 GPa (about 60 kbar), between about 6.0 GPa (about 60 kbar) and about 7.0 GPa (about 70 kbar), between about 7.0 GPa (about 70 kbar) and about 8.0 GPa (about 80 kbar), or between about 8.0 GPa (about 80 kbar) and about 8.5 GPa (about 85 kbar). In some embodiments, the green body is exposed to a pressure of about 6.0 GPa (about 60 kbar).

In some embodiments, the green body may be exposed to the HTHP conditions for about 10 minutes. However, the disclosure is not so limited and the green body may be exposed to the HTHP conditions for a different duration.

Exposing the green body to the HTHP conditions may form the impregnated cutting structure comprising the hard particles 204 dispersed in the binder material 210 and exhibiting a density that is substantially about 100% theoretical density.

Act 412 may include securing the impregnated cutting structure to a body of an earth-boring tool. The impregnated cutting structure may be secured to a body of an earth-boring tool (e.g., the earth-boring tool 100 (FIG. 1)), such as by welding, brazing, or another method. In some embodiments, the impregnated cutting structure is brazed to the body of the earth-boring tool. The impregnated cutting structure may be disposed in a pocket of the earth-boring tool and brazed thereto.

In some embodiments, forming the impregnated cutting structures 114 at HTHP conditions facilitates formation of an impregnated material exhibiting a higher density, increased strength, increased hardness, reduced porosity, and improved wear characteristics relative to impregnated materials formed by conventional sintering and pressing methods (e.g., hot isostatic pressing methods) that are not performed at HTHP conditions.

The impregnated cutting structures 114 may exhibit a higher density than conventionally formed impregnated cutting structures. In some embodiments, the impregnated cutting structures 114 may have a density between about 10.7 g/cm$^3$ and about 10.9 g/cm$^3$, such as between about 10.90 g/cm$^3$ and about 10.75 g/cm$^3$, between about 10.75 g/cm$^3$ and about 10.80 g/cm$^3$, between about 10.80 g/cm$^3$ and about 10.85 g/cm$^3$, or between about 10.85 g/cm$^3$ and about 10.90 g/cm$^3$. In some embodiments, the density may be greater than about 10.70 g/cm$^3$, greater than about 10.75 g/cm$^3$, greater than about 10.80 g/cm$^3$, greater than about 10.85 g/cm$^3$, or even greater than about 10.90 g/cm$^3$.

A porosity of the impregnated cutting structures may be between about 0.05% and about 3.0% less than a porosity of an impregnated cutting structure formed by conventional methods, such as between about 0.05% and about 0.10%, between about 0.10% and about 0.25%, between about 0.25% and about 0.50%, between about 0.50% and about 1.0%, between about 1.0% and about 2.0%, or between about 2.0% and about 3.0%.

Without wishing to be bound by any particular theory, it is believed that forming the impregnated cutting structures 114 (FIG. 1) at HTHP conditions facilitates improved densification of the impregnated material (e.g., the composite material 200 (FIG. 2)). Forming the impregnated cutting structures 114 at a pressure greater than about 4.0 GPa may facilitate forming the impregnated cutting structures 114 with metals exhibiting a melting temperature greater than about 1,200° C. may facilitate sintering the powder mixture at higher pressures without melting the binder material and without damaging (e.g., graphitizing) the material of the superabrasive particles, such as where the superabrasive particles comprise diamond. By way of comparison, conventional impregnated cutting structures are formed with a hot-isostatic pressing process and at a pressure less than about 1.0 MPa. The higher pressures used to form the impregnated cutting structures 114 described herein may facilitate increased packing (a lower porosity) and an increased density of the impregnated cutting structures 114. Accordingly, forming the impregnated cutting structures 114 to comprise a binder material exhibiting a relatively higher melting point compared to conventional binder materials used in impregnated cutting structures may facilitate exposing the powder mixture to a higher temperature and a higher pressure without graphitizing the diamond particles and without melting the binder material.

In addition, forming the impregnated cutting structures 114 (FIG. 1) at HTHP conditions in a press (e.g., a cubic press, a belt press, a toroid press, etc.) may increase the hardness, increase the strength, and improve the wear characteristics of the impregnated cutting structures 114 and of an earth-boring tool including the impregnated cutting structures 114. Without wishing to be bound by any particular theory, it is believed that exposing the powder mixture comprising the superabrasive particles (e.g., diamond particles) and the particles of the binder material to higher temperatures and pressures relative to conventionally formed impregnated cutting structures facilitates improved adhesion between the superabrasive particles and the binder material. During drilling of a subterranean formation with an earth-boring tool including the impregnated cutting structures 114, as the binder material surrounding the superabrasive particles begins to wear, the exposure of the superabrasive particles at the surface gradually increases until the superabrasive particles eventually fall away. However, as a result of the improved adhesion between the superabrasive particles and the binder material, the superabrasive particles may not fall away from the body of the impregnated cutting structure 114 until a relatively greater surface of the superabrasive particles become exposed. Accordingly, the wear characteristics of the impregnated cutting structure are improved. In addition, forming the binder material from binder materials exhibiting a melting temperature greater than about 1,200° C. may facilitate use of binder materials having a higher hardness than binder materials in conventional impregnated cutting structures. The increased hardness of the binder material may facilitate improved wear characteristics of the impregnated cutting structure including the binder material comprising the binder material.

EXAMPLES

Example 1

Impregnated cutting structures were formed with a powder mixture of superabrasive particles comprising diamond and a binder material comprising about 50 weight percent copper and about 50 weight percent nickel. The superabrasive particles comprised diamond having an average size of 20 mesh (i.e., about 850 μm). The diamonds constituted about 30 volume percent of the powder mixture and the binder material constituted about 70 volume percent of the powder mixture.

The powder mixture was placed in a graphite mold sized and shaped to form cylindrical impregnated cutting structures with a diameter of about 1.27 cm (about 0.500 inch) and a length of about 1.588 cm (about 0.625 inch). The mixture was exposed to a temperature of about 1,000° C. and a pressure of about 5.0 GPa (about 50 kbar) for about 10 minutes to form the impregnated cutting structures. The metal binder did not melt during exposure to the temperature and pressure.

The density of the powder mixture before exposure to the HTHP conditions and the density after exposure to the HTHP conditions were measured. The increase in density responsive to exposure to HTHP conditions was determined, as indicated in Table I below.

TABLE I

| Sample Number | Density Before Exposure (g/cm$^3$) | Density After Exposure (g/cm$^3$) | Density Increase (g/cm$^3$) |
| --- | --- | --- | --- |
| 1 | 10.7980 | 10.8113 | 0.0133 |
| 2 | 10.8045 | 10.8204 | 0.0160 |
| 3 | 10.8006 | 10.8116 | 0.0110 |
| 4 | 10.8156 | 10.8317 | 0.0161 |
| 5 | 10.7403 | 10.7450 | 0.0047 |
| 6 | 10.7420 | 10.7608 | 0.0188 |
| 7 | 10.7681 | 10.7900 | 0.0219 |
| 8 | 10.7582 | 10.7789 | 0.0207 |

Figure 5:
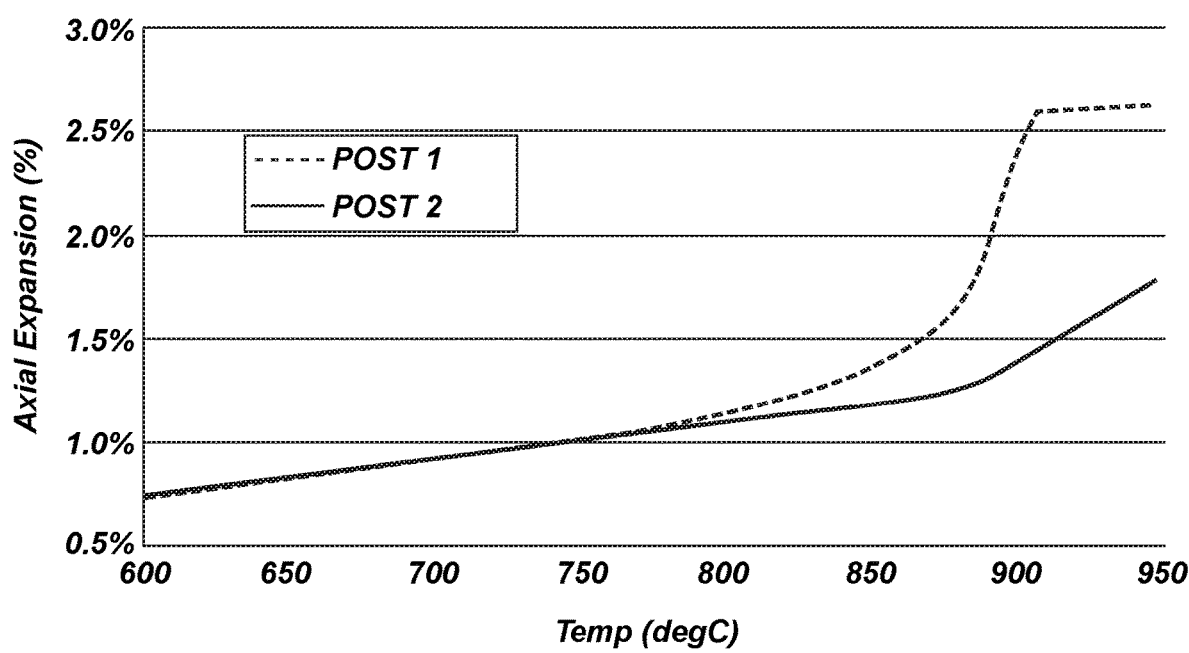
FIG. 5 is a graph illustrating a relationship between an axial expansion and a temperature of an impregnated cutting structure formed according to the methods described herein and an impregnated cutting structure formed according to conventional methods.

The adhesion between the diamond particles and the binder material of an impregnated cutting structure formed according to the methods described herein was estimated and compared to the adhesion of a conventionally formed impregnated cutting structure. The adhesion was estimated by measuring an increase in axial length of the impregnated cutting structures as a function of temperature of the impregnated cutting structures in an argon atmosphere. The impregnated cutting structures were heated at a rate of about 3° C./min. FIG. 5 illustrates the axial expansion as a function of temperature of the impregnated cutting structure formed according to the methods described herein (Post 2) compared to the axial expansion of the impregnated cutting structure formed according to conventional methods (Post 1). The impregnated cutting structure formed according to the methods described herein exhibited a lower degree of axial expansion with temperature than the conventionally formed impregnated cutting structure. In particular, at temperatures greater than about 750° C., the impregnated cutting structure formed according to the methods described herein exhibited less axial expansion than the conventionally formed impregnated cutting structure. By way of nonlimiting example, the impregnated structure formed according to the methods described herein exhibited a axial expansion of less than about 1.5% of an axial length of the impregnated cutting structure at a temperature of about 900° C. while the conventionally formed impregnated cutting structure exhibited an axial expansion greater than about 2.5% of the axial length of the impregnated cutting structure at a temperature of about 900° C. Without wishing to be bound by any particular theory, it is believed that the reduced expansion of the impregnated cutting structure formed by the methods described herein is due, at least in part, to better adhesion between the diamond particles and the metal binder material.

Example 2

A wear resistance of impregnated cutting structures formed according to the methods described herein was compared to a wear resistance of a conventionally formed impregnated cutting structure. A first impregnated cutting structure was formed by exposing a powder comprising a binder material and diamond particles to hot isostatic pressing conditions. The powder was exposed to a pressure of about 101 kPa (i.e., about 1.0 atm) and a temperature of about 1,000° C. The temperature and pressure were maintained such that the binder material did not melt. The first impregnated cutting structure exhibited an arithmetical mean height ($S_a$) of about 23 μm.

A second impregnated cutting structure was formed by exposing the powder mixture to a temperature greater than a melting temperature of the binder material and a pressure of about 101 kPa. The second impregnated cutting structure exhibited an arithmetical mean height $S_a$ of about 29 μm.

A third impregnated cutting structure was formed by exposing the powder mixture to a temperature of about 1,000° C. and a pressure of about 5.0 GPa. The temperature and pressure were maintained such that the binder material did not melt. The third impregnated cutting structure exhibited an arithmetical mean height $S_a$ of about 28 μm.

The wear resistance of each of the first impregnated cutting structure, the second impregnated cutting structure, and the third impregnated cutting structure were compared. A granite rock structure was cut with each of the first impregnated cutting structure, the second impregnated cutting structure, and the third impregnated cutting structure. The granite rock had an outer diameter of about 112 cm (about 44 inches). After 16 passes over the granite rock, the second impregnated cutting structure stopped cutting, indicating that the second impregnated cutting structure wherein the binder material melted was unstable. The first impregnated cutting structure exhibited a change in diameter of about 0.508 mm (about 0.02 inch) after 30 passes over the granite rock. The third impregnated cutting structure exhibited a change in diameter of about 0.0508 mm (about 0.002 inch) after 30 passes over the granite rock. Accordingly, after cutting a same amount of the granite rock, the third impregnated cutting structure formed by exposure to a pressure of about 5.0 GPa and a temperature of about 1,000° C. exhibited improved wear resistance compared to the first impregnated cutting structure and the second impregnated cutting structure.

Additional non-limiting example embodiments of the disclosure are set forth below.

Embodiment 1: A method of forming an impregnated cutting structure for an earth-boring tool, the method comprising: providing a powder mixture comprising diamond particles and a metal binder in a press; and subjecting the powder mixture to a pressure greater than about 4.0 GPa and a temperature greater than about 1,200° C. to densify the powder mixture and form an impregnated cutting structure comprising the diamond particles dispersed in a continuous phase comprising the metal binder, wherein the impregnated cutting structure is substantially free of diamond-to-diamond bonds and of carbides.

Embodiment 2: The method of Embodiment 1, further comprising subjecting the powder mixture in the press to a pressure between about 100 MPa and about 1,000 MPa to form a green body prior to subjecting the powder mixture to a pressure greater than about 4.0 GPa and a temperature greater than about 1,200° C.

Embodiment 3: The method of Embodiment 2, wherein subjecting the powder mixture in the press to a pressure between about 100 MPa and about 1,000 MPa to form a green body comprises subjecting the powder mixture to a pressure about 100 MPa and about 1,000 MPa at a temperature between about 20° C. and about 25° C.

Embodiment 4: The method of Embodiment 2 or Embodiment 3, wherein subjecting the powder mixture to a pressure greater than about 4.0 GPa and a temperature greater than about 1,200° C. comprises subjecting the green body to a pressure greater than about 4.0 GPa and a temperature greater than about 1,200° C.

Embodiment 5: The method of any one of Embodiments 1 through 4, wherein providing a powder mixture comprising diamond particles and a metal binder in a press comprises providing a powder mixture substantially free of carbides in the press.

Embodiment 6: The method of any one of Embodiments 1 through 5, further comprising selecting the powder mixture to consist essentially of the diamond particles and the metal binder.

Embodiment 7: The method of any one of Embodiments 1 through 5, further comprising selecting the diamond particles to constitute between about 40 volume percent and about 45 volume percent of the powder mixture.

Embodiment 8: The method of Embodiment 7, further comprising selecting the metal binder to constitute a remainder of the powder mixture.

Embodiment 9: The method of any one of Embodiments 1 through 8, further comprising selecting the metal binder to consist essentially of iron and at least one of nickel and cobalt.

Embodiment 10: The method of any one of Embodiments 1 through 8, further comprising selecting the metal binder to comprise at least one of manganese and vanadium.

Embodiment 11: The method of any one of Embodiments 1 through 10, further comprising selecting the metal binder to have a melting point greater than about 1,300° C.

Embodiment 12: The method of any one of Embodiments 1 through 11, wherein subjecting the powder mixture to a pressure greater than about 4.0 GPa comprises subjecting the powder mixture to a pressure greater than about 6.5 GPa.

Embodiment 13: The method of any one of Embodiments 1 through 12, wherein subjecting the powder mixture to a pressure greater than about 4.0 GPa and a temperature greater than about 1,200° C. to densify the powder mixture and form an impregnated cutting structure comprises forming an impregnated cutting structure comprising a substantially uniform distribution of the diamond particles in the continuous phase.

Embodiment 14: The method of any one of Embodiments 1 through 13, further comprising selecting the diamond particles to comprise single-crystal diamond.

Embodiment 15: A method of forming an earth-boring tool including an impregnated cutting structure, the method comprising: forming an impregnated cutting structure, comprising: providing a powder mixture comprising diamond particles and a metal binder in a press; and subjecting the powder mixture to a pressure greater than about 4.0 GPa and a temperature greater than about 1,200° C. to densify the powder mixture and form an impregnated cutting structure comprising the diamond particles dispersed in the metal binder, wherein the impregnated cutting structure is substantially free of diamond-to-diamond bonds and carbides; and attaching the impregnated cutting structure to a blade of an earth-boring tool.

Embodiment 16: The method of Embodiment 15, further comprising selecting the metal binder to consist essentially of iron and at least one of cobalt and nickel.

Embodiment 17: The method of Embodiment 15 or Embodiment 16, wherein subjecting the powder mixture to a pressure greater than about 4.0 GPa and a temperature greater than about 1,200° C. comprises subjecting the powder mixture to a temperature greater than about 1,500° C.

Embodiment 18: An earth-boring tool for drilling subterranean formations, the earth-boring tool comprising: a bit body; at least one blade in a crown region of the bit body; and at least one impregnated cutting structure attached to the at least one blade, the at least one impregnated cutting structure comprising diamond particles dispersed substantially uniformly in a metal binder in at least one region of at least one impregnated cutting structure, the at least one impregnated cutting structure substantially free of diamond-to-diamond bonds and carbides, and formed by exposing a powder mixture comprising the diamond particles and a binder material to a pressure greater than about 4.0 GPa and a temperature greater than about 1,200° C.

Embodiment 19: The earth-boring tool of Embodiment 18, wherein the metal binder has a melting point greater than about 1,300° C.

Embodiment 20: The earth-boring tool of Embodiment 18 or Embodiment 19, wherein the metal binder consists essentially of nickel and iron.

Although the foregoing description contains many specifics, these are not to be construed as limiting the scope of the disclosure, but merely as providing certain embodiments. Similarly, other embodiments may be devised that do not depart from the scope of the invention. For example, features described herein with reference to one embodiment also may be provided in others of the embodiments described herein. The scope of the invention is, therefore, indicated and limited only by the appended claims and their legal equivalents, rather than by the foregoing description. All additions, deletions, and modifications to embodiments of the disclosure, as described and illustrated herein, which fall within the meaning and scope of the claims, are encompassed by the invention.

What is claimed is:

1. A method of forming an impregnated cutting structure for an earth-boring tool, the method comprising:
    providing a powder mixture comprising diamond particles and a metal binder in a press, the powder mixture free of carbides; and
    subjecting the powder mixture to a pressure greater than about 6.0 GPa and a temperature greater than about 1,400° C. to densify the powder mixture and form an impregnated cutting structure comprising the diamond particles dispersed in a continuous phase comprising the metal binder, wherein the impregnated cutting structure is substantially free of diamond-to-diamond bonds and of carbides.

2. The method of claim 1, further comprising subjecting the powder mixture in the press to a pressure between about 100 MPa and about 1,000 MPa to form a green body prior to subjecting the powder mixture to a pressure greater than about 4.0 GPa and a temperature greater than about 1,200° C.

3. The method of claim 2, wherein subjecting the powder mixture in the press to a pressure between about 100 MPa and about 1,000 MPa to form a green body comprises subjecting the powder mixture to a pressure about 100 MPa and about 1,000 MPa at a temperature between about 20° C. and about 25° C.

4. The method of claim 2, wherein providing a powder mixture comprising diamond particles and a metal binder in a press comprises providing a powder mixture substantially free of carbides in the press.

5. The method of claim 1, wherein subjecting the powder mixture to a pressure greater than about 6.0 GPa and a temperature greater than about 1,400° C. comprises forming the impregnated cutting structure to have a density between about 10.7 g/cm$^3$ and about 10.9 g/cm$^3$ and a porosity between about 0.05% and about 3.0%.

6. The method of claim 1, further comprising selecting the powder mixture to consist essentially of the diamond particles and the metal binder.

7. The method of claim 1, further comprising selecting the diamond particles to constitute between about 40 volume percent and about 45 volume percent of the powder mixture.

8. The method of claim 7, further comprising selecting the metal binder to constitute a remainder of the powder mixture.

9. The method of claim 1, further comprising selecting the metal binder to consist essentially of iron and at least one of nickel and cobalt, the weight percent of the iron within the metal binder between about 20 weight percent and about 80 percent and the weight percent of the at least one of nickel and cobalt within the metal binder between about 20 weight percent and about 80 percent.

10. The method of claim 1, further comprising selecting the metal binder to comprise at least one of manganese and vanadium.

11. The method of claim 1, further comprising selecting the metal binder to have a melting point greater than about 1,300° C., wherein subjecting the powder mixture to a pressure greater than about 6.0 GPa and a temperature greater than about 1,400° C. comprises subjecting the powder mixture to a temperature less than the melting point of the metal binder.

12. The method of claim 1, wherein subjecting the powder mixture to a pressure greater than about 4.0 GPa comprises subjecting the powder mixture to a pressure greater than about 6.5 GPa.

13. The method of claim 1, wherein subjecting the powder mixture to a pressure greater than about 4.0 GPa and a temperature greater than about 1,200° C. to densify the powder mixture and form an impregnated cutting structure comprises forming an impregnated cutting structure comprising a substantially uniform distribution of the diamond particles in the continuous phase.

14. The method of claim 1, further comprising selecting the diamond particles to comprise single-crystal diamond.

15. A method of forming an earth-boring tool including an impregnated cutting structure, the method comprising:
  forming an impregnated cutting structure, comprising:
    providing a powder mixture comprising diamond particles and a metal binder in a press, the diamond particles coated with a metal coating; and
    subjecting the powder mixture to a pressure greater than about 4.0 GPa and a temperature greater than about 1,200° C. to densify the powder mixture and form an impregnated cutting structure comprising the diamond particles dispersed in the metal binder, wherein the impregnated cutting structure is substantially free of diamond-to-diamond bonds and carbides; and
  attaching the impregnated cutting structure to a blade of an earth-boring tool.

16. The method of claim 15, further comprising selecting the metal binder to consist essentially of iron and at least one of cobalt and nickel, the binder free of copper.

17. The method of claim 15, wherein:
  subjecting the powder mixture to a pressure greater than about 4.0 GPa and a temperature greater than about 1,200° C. comprises subjecting the powder mixture to a temperature greater than about 1,500° C.; and
  providing a powder mixture comprising diamond particles and a metal binder in a press, the diamond particles coated with a metal coating comprises providing diamond particles coated with the same metal as the metal of the metal binder.

18. An earth-boring tool for drilling subterranean formations,
  the earth-boring tool comprising:
  a bit body;
  at least one blade in a crown region of the bit body; and
  at least one impregnated cutting structure attached to the at least one blade, the at least one impregnated cutting structure comprising diamond particles coated with a metal coating and dispersed substantially uniformly in a metal binder in at least one region of at least one impregnated cutting structure, the at least one impregnated cutting structure substantially free of diamond-to-diamond bonds and carbides, and formed by exposing a powder mixture comprising the diamond particles coated with the metal coating and the metal binder material to a pressure greater than about 4.0 GPa and a temperature greater than about 1,200° C.

19. The earth-boring tool of claim 18, wherein the metal binder has a melting point greater than about 1,300° C.

20. The earth-boring tool of claim 18, wherein;
  the metal binder consists essentially of nickel and iron; and
  the metal coating comprises a transition metal.

* * * * *